US006880134B2

(12) United States Patent
Drennan

(10) Patent No.: US 6,880,134 B2
(45) Date of Patent: Apr. 12, 2005

(54) METHOD FOR IMPROVING CAPACITOR NOISE AND MISMATCH CONSTRAINTS IN A SEMICONDUCTOR DEVICE

(75) Inventor: Patrick G. Drennan, Gilbert, AZ (US)

(73) Assignee: Freescale Semiconductor, Inc., Austin, TX (US)

(*) Notice: Subject to any disclaimer, the term of this patent is extended or adjusted under 35 U.S.C. 154(b) by 29 days.

(21) Appl. No.: 10/409,988

(22) Filed: Apr. 9, 2003

(65) Prior Publication Data

US 2004/0205679 A1 Oct. 14, 2004

(51) Int. Cl.[7] .............................................. G06F 17/50
(52) U.S. Cl. ....................... 716/2; 716/1; 716/4; 716/5; 716/8
(58) Field of Search ............................... 716/1, 2, 4, 5, 716/8

(56) References Cited

U.S. PATENT DOCUMENTS

| 5,175,521 A |   | 12/1992 | Larson |   |
|---|---|---|---|---|
| 5,208,725 A |   | 5/1993 | Akcasu |   |
| 5,322,438 A | * | 6/1994 | McNutt et al. | ................. 716/8 |
| 5,583,359 A |   | 12/1996 | Ng |   |
| 5,644,313 A |   | 7/1997 | Rakers |   |
| 5,945,728 A | * | 8/1999 | Dobkin et al. | ............... 257/666 |
| 6,243,653 B1 | * | 6/2001 | Findley | ........................ 702/65 |
| 6,385,033 B1 | * | 5/2002 | Javanifard et al. | ....... 361/306.2 |

FOREIGN PATENT DOCUMENTS

| JP | 59105341 A | 6/1984 |
| JP | 01084616 | 3/1989 |
| JP | 04096359 A | 3/1992 |

OTHER PUBLICATIONS

Aparacio et al., "Capacity Limits and Matching Properties of Integrated Capacitors," IEEE Journal of Solid–State Circuits, vol. 37, No. 3, Mar. 2002, pp. 384–393.

Arora et al., "Modeling and Extraction of Interconnect Capacitances for Multilayer VLSI Circuits," IEEE Transactions on Computer–Aided Design of Integrated Circuits and Systems, vol. 15, No. 1, Jan. 1996, pp. 58–67.

Garrity et al., "A 10 bit , 2Ms/s, 15mW BiCMOS Cyclic RSD A/D Converter," Motorola, Inc., Schaumburg, IL, 4 pgs.

* cited by examiner

Primary Examiner—Stacy A. Whitmore
(74) Attorney, Agent, or Firm—Daniel D. Hill

(57) ABSTRACT

In one embodiment, a method (50) is provided for improving switched capacitor performance by lowering a mismatch constraint to be equal to, or nearly equal to, a noise constraint. The mismatch constraint is lowered by increasing a finger spacing of a fringe capacitor design (10) while maintaining the same surface area covered by the fringe capacitor design (10). In another embodiment, a noise constraint is lowered by decreasing finger spacing. Lowering the noise constraint by decreasing finger spacing reduces the area of a fringe capacitor used in, for example, an analog-to-digital converter. Both embodiments may improve performance of the analog-to-digital converter by lowering power consumption, increasing speed, or both.

19 Claims, 2 Drawing Sheets

METHOD FOR IMPROVING CAPACITOR NOISE AND MISMATCH CONSTRAINTS IN A SEMICONDUCTOR DEVICE

FIELD OF THE INVENTION

The present invention relates generally to capacitor design, and more particularly, to a method for improving capacitor noise and mismatch constraints in a semiconductor device having a fringe capacitor.

BACKGROUND OF THE INVENTION

Capacitors are used in many integrated circuit applications, such as for example, switched capacitors in analog-to-digital converters (ADCs). There are many ways to implement integrated circuit capacitors. The "fringe" capacitor is one type of integrated circuit capacitor that is widely used because it provides good capacitance density.

Two desirable attributes of many integrated circuit designs, including ADCs are low power consumption and/or high speed operation. Therefore, it would be desirable to size the capacitors used in ADCs as small as possible. However, for fringe capacitors used in switched capacitor circuits, noise and mismatch constraints limit the minimum capacitance value that can be used. The noise constraint is determined by MOSFET thermal switching noise and the mismatch constraint is determined by physical variations in the metal used to form the fringe capacitor. Both of these constraints are process dependent, with the mismatch constraint typically dominating the noise constraint and requiring a larger capacitance value than the noise constraint, thus increasing power consumption and/or reducing speed of the integrated circuit.

Therefore, there is a need to decrease the capacitance value of a fringe capacitor used in a switched capacitor integrated circuit design.

DETAILED DESCRIPTION

Figure 1:
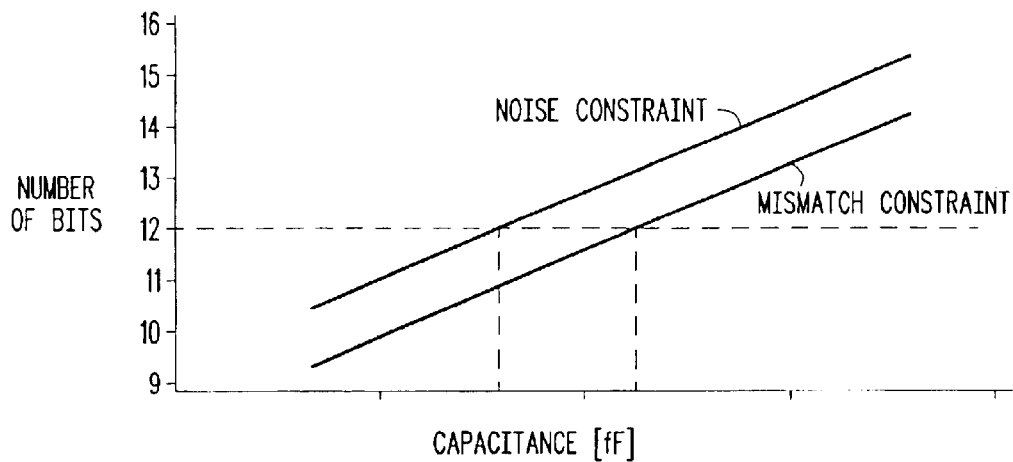
FIG. 1 is a graph illustrating bit resolution versus capacitance for mismatch and noise constraints for a fringe capacitor.

Generally, the present invention provides, in one embodiment, a method for improved switched capacitor performance by lowering a mismatch constraint to be equal to, or nearly equal to, a noise constraint. The mismatch constraint is lowered by increasing a finger spacing of a fringe capacitor design while maintaining the same area of the fringe capacitor. In another embodiment, a noise constraint is lowered by decreasing finger spacing. Lowering the mismatch constraint reduces the capacitance value of the fringe capacitor. Lowering the noise constraint reduces the area of the fringe capacitor, thereby reducing the parasitic capacitance, the chip size and the cost to manufacture an integrated circuit having the fringe capacitor. Both configurations may be used in, for example, and an analog-to-digital converter.

The size of a capacitor in a switched capacitor design is determined by several factors. Two of these factors are mismatch and noise. A noise limitation, or constraint, comes from the thermal noise produced on MOSFETs (metal oxide semiconductor field effect transistors) used as switches. A mismatch constraint is defined by the statistical variation of individual capacitors on the same integrated circuit, or die. If the statistical variation exceeds a given circuit measure the integrated circuit suffers from manufacturing yield loss. For example, if the statistical variation exceeds the desired bit resolution for a data converter, integrated and/or discrete non-linearity errors result. By definition, mismatch variation is inversely proportional to geometry. For example, larger devices have less variation than smaller devices. But larger devices consume die space which adds to the cost to manufacture, require more power, and slow down the circuit performance.

At any given point in time, the charge placed on a fringe capacitor is subject to some variation due to MOSFET thermal noise. There is a design requirement limit for the percentage variation in capacitor charge for an RSD (redundant signed digit) stage of an ADC which is given by $$C = (2^{2(n+b)+4}) kT / 3 V_P^2 OSR \qquad \text{Equation 1}$$

where,

C=the capacitance, n=number of bits of resolution, b=number of bits for margin, k=Boltzman's constant, T=temperature, $V_P$=peak input/output voltage, and OSR=oversample ratio.

It has been determined through experimentation that for a given fringe capacitor, mismatch is determined primarily by the surface area of the capacitor and is not determined by capacitance. Also, the noise limitation is dependent on capacitance. For a given fringe capacitor layout, mismatch can be improved by increasing finger spacing while maintaining a predetermined surface area. The predetermined surface area is maintained by removing fingers from the fringe capacitor design. Therefore, the size of the fringe capacitor is determined to satisfy both mismatch and noise constraints for the switched capacitor design. By maintaining the layout area of the capacitor and adjusting finger spacing, the capacitance density can be lowered to shift the mismatch constraint to be consistent with the noise constraint. In addition to improving the mismatch constraint, lowering the capacitance of a switched capacitor design provides the advantages of reduced power consumption and/or increased speed. In addition, increasing finger spacing provides the added advantages of improving particle defect robustness and improving reliability.

FIG. 1 is a graph illustrating bit resolution versus capacitance for mismatch and noise constraints for a fringe capacitor. The noise requirement is generally determined by the desired bit resolution for a given input voltage range. The noise constraint and the mismatch constraint can be plotted simultaneously as shown in FIG. 1. As illustrated in FIG. 1, mismatch is the limiting factor. As established above, mismatch is determined by the capacitor area. That is, if the finger spacing is increased to lower the capacitance per area, the lower curve (mismatch constraint) in FIG. 1 is shifted to the left so that it meets the upper curve (noise constraint). The reduction in capacitance value can be many times less as a result of shifting the mismatch constraint. Because capacitance is linearly proportional to current (i.e. power) and inversely proportional to switched capacitor speed, the speed and/or power consumption can be improved greatly by only a relatively modest reduction in capacitance value.

Figure 2:
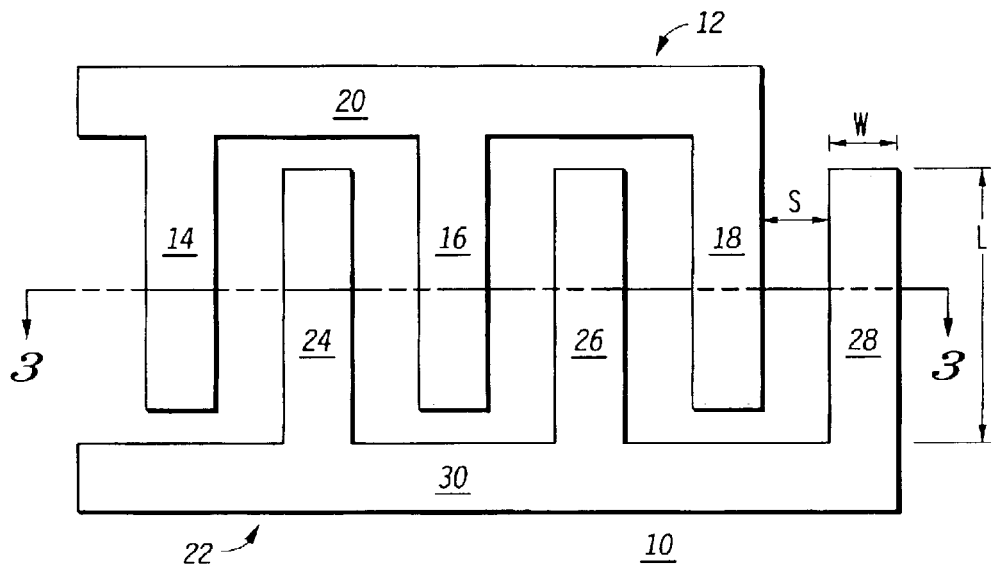
FIG. 2 illustrates a top down view of a fringe capacitor.
Figure 3:
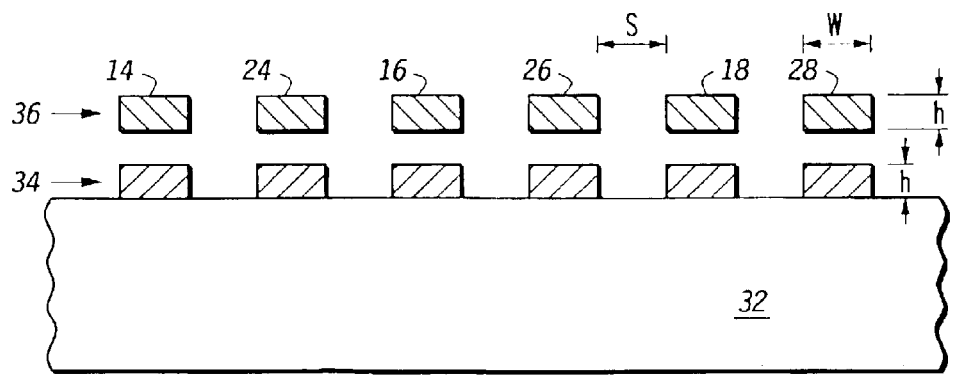
FIG. 3 is a cross-sectional view of the fringe capacitor of FIG. 2 along the line 3—3.

FIG. 2 illustrates a top down view of a fringe capacitor 10 implemented on a semiconductor substrate. In a top metal layer, fringe capacitor 10 includes comb-shaped elements 12 and 22. Comb-shaped element 12 includes a plurality of metal fingers represented by metal fingers 14, 16, and 18. Each of fingers 14, 16, and 18 are integrally connected to a conductor 20. Conductor 20 is coupled to a voltage potential. Comb-shaped element 22 includes a plurality of metal fingers represented by metal fingers 24, 26, and 28. Each of fingers 24, 26, and 28 are integrally connected to a conductor 30. The fingers of comb-shaped element 12 are interleaved with the fingers of comb-shaped element 22. Any number of fingers may be used depending on the desired capacitance value. Typically, all of the fingers have a width labeled "W", a length labeled "L", and a space between each of the fingers labeled "S as illustrated in FIG. 2. Conductor 30 may be coupled to another voltage potential or ground. Comb-shaped elements 12 and 22 may be formed from a metal, such as for example, aluminum or copper, or from another type of conductive material, such as for example, polysilicon. Also, fringe capacitor 10 may be formed using multiple conductive layers. In the illustrated embodiment, fringe capacitor 10 is formed using two metal layers as illustrated in FIG. 3, discussed below. In other embodiments, fringe capacitor 10 may have four or more metal layers.

FIG. 3 is a cross-sectional view of the fringe capacitor of FIG. 2 along the line 3—3. Top metal layer 36 includes comb-shaped elements 12 and 22. Another metal layer 34 underlies top metal layer 36 and includes comb-shaped elements similar to comb-shaped elements 12 and 22. Metal layer 34 is formed on a semiconductor substrate 32, and has a thickness labeled "h". An insulating material (not shown) is formed around and over the comb-shaped elements of metal layer 34. Metal layer 36 is then formed above metal layer 36 on the insulating material. As mentioned above, a fringe capacitor may have many such metal layers.

To a first order estimate, the capacitance value of a fringe capacitor is generally inversely proportional to finger spacing. If the finger spacing is increased, fingers are removed from the design to satisfy the objective of maintaining a constant area for mismatch.

An area $A_1$ of an initial fringe capacitor design can be expressed as $$A_1 = 2LN_{f1}(W+S) \quad \text{Equation 2}$$

where

L=finger length,
$N_{f1}$=number of fingers of initial design,
W=finger width, and
S=finger spacing.

If finger spacing is increased by a factor k, an area $A_2$ of the modified fringe capacitor design becomes $$A_2 = 2LN_{f2}(W+S) \quad \text{Equation 3}$$

$N_{f2}$=number of fingers of modified design
Setting areas $A_1=A_2$ to satisfy the mismatch objective, $$N_{f2}/N_{f1}=(W+S)/(W+kS) \quad \text{Equation 4}$$

And if W≈S, then $$N_{f2}/N_{f1}=2/(k+1) \quad \text{Equation 5}$$

The capacitance of the fringe capacitor with the unmodified finger spacing is $$C_1=(N_{f1}-1)LC_{density} \approx N_{f1}LC_{density} \quad \text{Equation 6}$$

The capacitance of the modified fringe capacitor design with the new finger spacing is $$C_2=(N_{f2}-1)LC_{density}/K \approx N_{f2}LC_{density}/k \quad \text{Equation 7}$$

where $C_{density}$ is the capacitance per area for the initial fringe capacitor design with the unmodified finger spacing. Combining Equations 6 and 7, $$N_{f2}/N_{f1}=K\,C_2/C_1 \quad \text{Equation 8}$$

Which combined with Equation 5 produces $$C_2/C_1=2/k(k+1) \quad \text{Equation 9}$$

or $$k = \sqrt{\frac{2C_1}{C_2}+0.25}-0.5 \quad \text{Equation 10}$$

Equation 10 defines the increase in finger spacing required to reduce the capacitance. The approximately square relationship between spacing and capacitance means that an unusually large change in spacing is not required to obtain large changes in capacitance.

Figure 4:
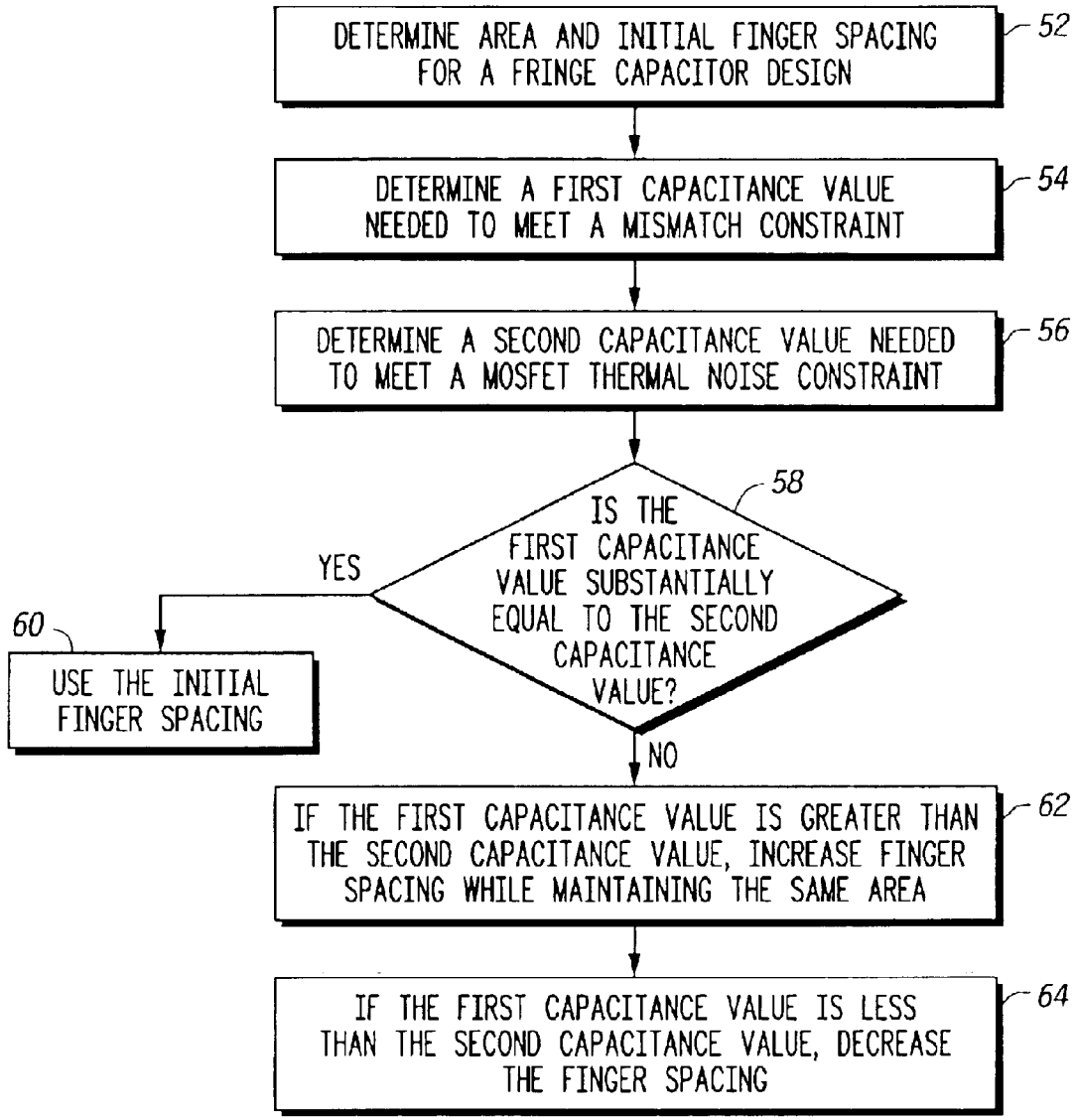
FIG. 4 illustrates a flow chart for reducing a capacitance value for a fringe capacitor in an integrated circuit design.

FIG. 4 is a flow chart for illustrating a method 50 for reducing a capacitance value for a fringe capacitor in an integrated circuit design. In one embodiment, method 50 may be implemented in software on a data processing system (not shown). At step 52, a preliminary design layout for a fringe capacitor used in, for example, a switched capacitor is determined including an area and a finger spacing. At step 54, the switched capacitor design is evaluated to determine a first capacitance value needed to meet a fringe capacitor mismatch constraint for a particular semiconductor manufacturing process. At step 56, a second capacitance value is determined to meet a MOSFET thermal noise requirement of the switched capacitor. At decision step 58, if the first capacitance value is substantially equal to the second capacitance value and the capacitance value of the fringe capacitor exceeds the first and second capacitance value, then the YES path is taken to step 60 and the fringe capacitor with the initial finger spacing may be used. If the first and second capacitance values are not substantially equal, then the NO path is taken to step 62. At step 62, if the first capacitance value is greater than the second capacitance value, then the mismatch constraint requires a greater capacitance value than the noise constraint as illustrated above in the graph of FIG. 1. The finger spacing is increased using Equation 10 as set out above, while maintaining the same area to decrease the capacitance density of the fringe capacitor. However, as shown at step 64, if the first capacitance value is less than the second capacitance value, then the noise constraint requires a greater capacitance value than the mismatch constraint and the capacitance density may be decreased by, for example, decreasing finger spacing. Method 50 can be repeated as necessary with the new finger spacing to confirm the results.

Method 50 is useful for sizing fringe capacitors that are used in switched capacitor circuits of analog-to-digital converters (ADCs), such as the ADC described in U.S. Pat. No. 5,644,313, issued to Rakers et al. and entitled "Redundant Signed Digit A-to-D Conversion Circuit and Method Thereof", which is incorporated by reference in its entirety herein.

By lowering the mismatch constraint to be equal to, or nearly equal to, the noise constraint of a fringe capacitor, a switched capacitor circuit using the lower capacitance value benefits by lower power consumption, increased operating speed, or both.

While the invention has been described in the context of a preferred embodiment, it will be apparent to those skilled in the art that the present invention may be modified in numerous ways and may assume many embodiments other than that specifically set out and described above. Accordingly, it is intended by the appended claims to cover all modifications of the invention which fall within the true scope of the invention.

What is claimed is:

1. A method for satisfying a mismatch constraint of a fringe capacitor design comprising the steps of:
    providing a first fringe capacitor design with a predetermined area and a first finger spacing;
    determining a first capacitance value of the first fringe capacitor design to meet the mismatch constraint;
    determining a second capacitance value to meet a MOSFET (metal oxide semiconductor field effect transistor) thermal noise constraint of the first fringe capacitor design;
    determining that the second capacitance value is less than the first capacitance value; and
    increasing the finger spacing from the first finger spacing to a second finger spacing while maintaining the same predetermined area to obtain a second fringe capacitor design, wherein the second fringe capacitor design has a lower mismatch constraint than the first fringe capacitor design.

2. The method of claim 1, wherein the step for increasing the finger spacing includes increasing the finger spacing by a factor k where $$k = \sqrt{\frac{2C_1}{C_2} + 0.25} - 0.5$$

and $C_1$ is a capacitance value of the first fringe capacitor design and $C_2$ is a capacitance value of the second fringe capacitor design.

3. The method of claim 1, wherein the step of increasing the finger spacing includes maintaining the predetermined area by removing one or more fingers from the second fringe capacitor design.

4. The method of claim 1, wherein the second fringe capacitor design is implemented in a semiconductor device using more than one metal layer.

5. The method of claim 1, wherein the method is iteratively repeated.

6. The method of claim 1, wherein the second fringe capacitor design is used for designing a switched capacitor circuit.

7. The method of claim 6, wherein the switched capacitor circuit is used in an analog-to-digital circuit.

8. A method for satisfying a noise constraint of a fringe capacitor design comprising the steps of:
    providing a first fringe capacitor design with a first finger spacing;
    determining a first capacitance value of the first fringe capacitor design to meet a mismatch constraint;
    determining a second capacitance value to meet a MOSFET (metal oxide semiconductor field effect transistor) thermal noise constraint of the first fringe capacitor design;
    determining that the second capacitance value is greater than the first capacitance value; and
    decreasing the finger spacing from the first finger spacing to a second finger spacing to obtain a second fringe capacitor design, wherein the second fringe capacitor design has a lower noise constraint than the first fringe capacitor design.

9. The method of claim 8, wherein the second fringe capacitor design is implemented in a semiconductor device using more than one metal layer.

10. The method of claim 8, wherein the method is iteratively repeated.

11. The method of claim 8, wherein the step of decreasing the finger spacing includes reducing an area of the second fringe capacitor design.

12. The method of claim 8, wherein the second fringe capacitor design is used for designing a switched capacitor circuit.

13. The method of claim 12, wherein the switched capacitor circuit is used in an analog-to-digital circuit.

14. A method for satisfying a predetermined design constraint of a fringe capacitor design comprising:
    defining the predetermined constraint;
    determining that a first fringe capacitor design having a first finger spacing does not meet the predetermined constraint; and
    increasing the finger spacing while maintaining a predetermined area by removing one or more fingers from the second fringe capacitor design.

15. The method of claim 14, wherein the predetermined constraint is a mismatch constraint.

16. The method of claim 14, wherein adjusting the finger spacing includes decreasing the finger spacing.

17. The method of claim 14, wherein the predetermined constraint is characterized as a mismatch constraint.

18. The method of claim 14, wherein the second fringe capacitor design is implemented in a semiconductor device having more than one metal layer.

19. The method of claim 14, wherein adjusting the finger spacing includes increasing the finger spacing by a factor k where $$k = \sqrt{\frac{2C_1}{C_2} + 0.25} - 0.5$$

and $C_1$ is a capacitance value of the first fringe capacitor design and $C_2$ is a capacitance value of the second fringe capacitor design.

* * * * *